United States Patent [19]
Stoll

[11] 4,037,316
[45] July 26, 1977

[54] METHOD OF ASSEMBLING TEMPERATURE RESPONSIVE RESISTANCE MEMBER

[75] Inventor: Donald H. Stoll, Morrison, Ill.

[73] Assignee: General Electric Company, Fort Wayne, Ind.

[21] Appl. No.: 671,961

[22] Filed: Mar. 30, 1976

Related U.S. Application Data

[62] Division of Ser. No. 508,457, Sept. 23, 1974, abandoned.

[51] Int. Cl.² .................... H01H 11/00; H01C 17/02
[52] U.S. Cl. ...................................... 29/622; 29/613; 29/619; 29/621; 29/628; 200/303; 310/68 C; 337/107; 361/27
[58] Field of Search ................. 29/610, 612, 613, 619, 29/621, 622, 588, 589, 628; 338/22 R; 317/13 C, 13 B, 13 R, 41; 318/221 H, 221 C, 221 B, 221 A, 471, 472; 310/68 C; 200/303, 293; 337/107, 102, 100

[56] References Cited

U.S. PATENT DOCUMENTS

| 2,114,591 | 4/1938 | Clark | 29/613 X |
| 3,532,840 | 10/1970 | Bauer | 200/303 X |
| 3,737,752 | 6/1973 | Strachan | 318/471 |
| 3,835,434 | 9/1974 | Kahn | 29/613 X |
| 3,840,834 | 10/1974 | Obenhaus | 337/79 |

Primary Examiner—Victor A. DiPalma
Attorney, Agent, or Firm—Joseph E. Papin

[57] ABSTRACT

A method of assembling a temperature responsive resistance member within a pair of separable housings. This method includes the steps of: mounting the temperature responsive resistance member in both supporting engagement and electrical contacting engagement between a pair of electrical terminals; and joining the separable housings against displacement so that the temperature responsive resistance member in both the supporting engagement and the electrical contacting engagement with the terminals is disposed within the housings in predetermined spaced relation therewith with portions of the terminals extending exteriorly of the housings.

23 Claims, 8 Drawing Figures

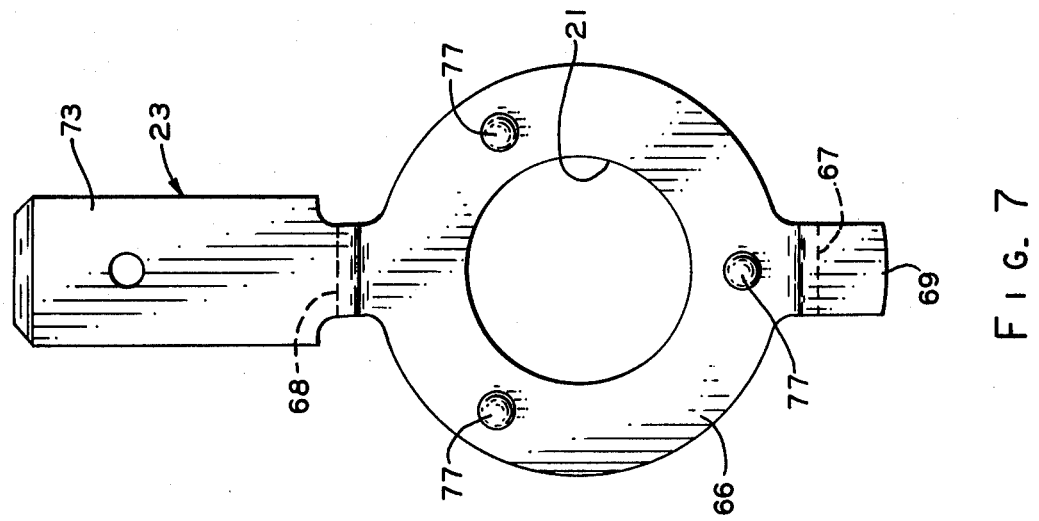
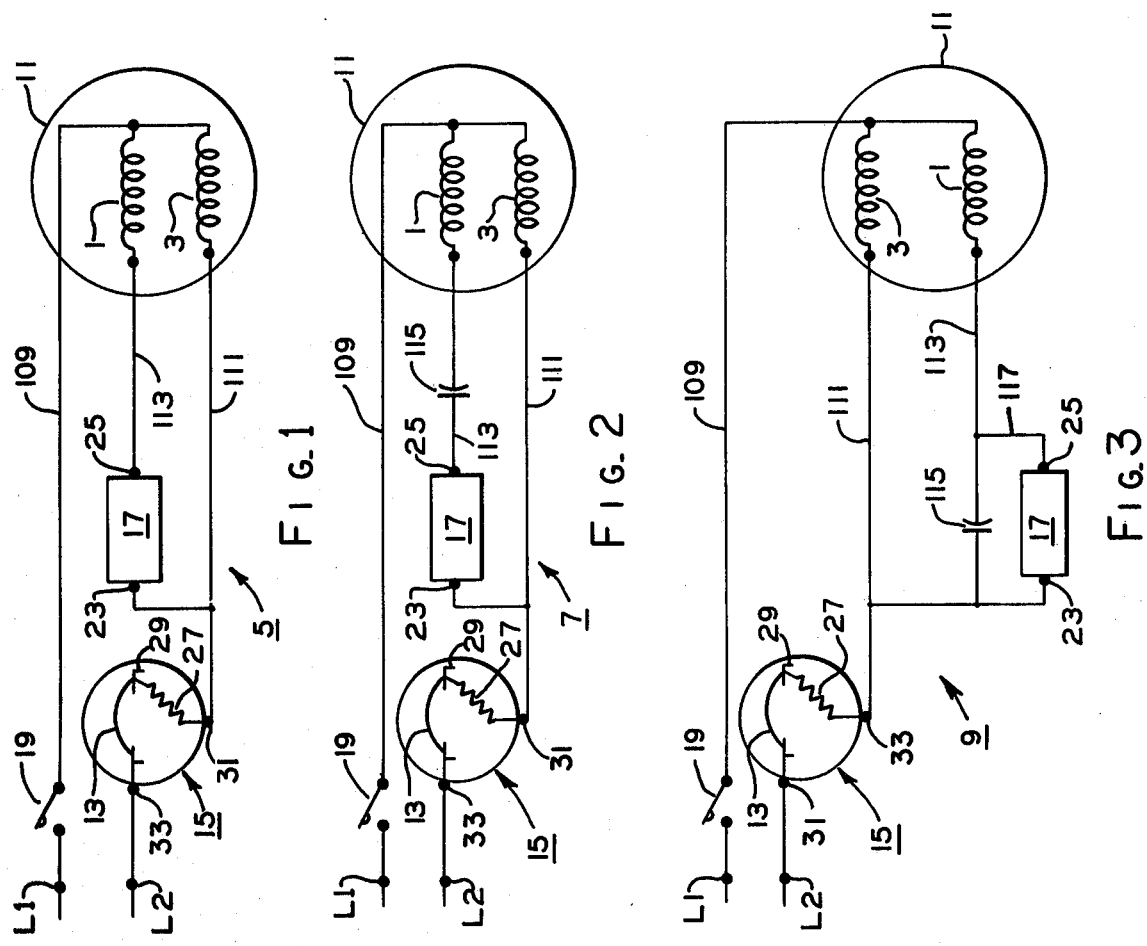

METHOD OF ASSEMBLING TEMPERATURE RESPONSIVE RESISTANCE MEMBER

CROSS REFERENCE TO RELATED APPLICATION

This application is a division of parent application Ser. No. 508,457 filed Sep. 23, 1974 (now abandoned) which is incorporated herein by reference.

BACKGROUND OF THE INVENTION

This invention relates generally to dynamoelectric machines and in particular to a method for assembling a temperature responsive resistance member.

In the past, various devices and methods have been employed to start a dynamoelectric machine, such as a split phase electric motor for instance, and also to protect the windings thereof in the event of the occurrence of an overload condition which, of course, may have had the deleterious effect of destroying or burning out such windings.

In one such particular past protector device, a positive temperature coefficient resistor (hereinafter referred to as a PTCR) was connected serially with a start winding of a split phase type motor. Upon energization of the motor with the PTCR at a low temperature, sufficient current was passed by the PTCR to energize the start winding thereby to assist in the energization of the motor. Of course, as well known in the art, the PTCR is self-heating upon energization wherein the resistance of the PTCR is increased generally as a function of its increasing temperature. Therefore at elevated temperatures of the PTCR, it acted to limit passage of current applied therethrough to the start winding to an acceptable minimum value which, in effect, electrically disassociated the start winding from circuit relation with the run windings of the motor generally upon the motor attaining its running speed. Of course, one of the disadvantageous or undesirable features of employing a PTCR as a starting resistor is believed to be the time required, after the motor was de-energized or turned-off, for the PTCR to cool sufficiently in order to restart the motor. In some instances, it is believed that at least 1 or 2 minutes may have been necessary to cool the PTCR to a temperature value at which it may pass sufficient current to effect motor restarting.

Another disadvantageous or undersirable feature of at least some of the past protector devices employed with small motors (such as those which may be used to operate refrigerators, freezers or other appliances or the like) is believed to be that they did not have sufficient "off" time to allow the PTCR to cool for restarting the motor when the motor was subjected to a locked rotor condition for instance. A high current draw is encountered under locked rotor conditions, and during the "on" cycle of the protector device, the temperature of the PTCR would, of course, increase. However, when so subjected to such locked rotor condition, the protector device was responsive to the relatively high current draw to revert its off cycle. In the off cycle, the protector device was operable generally to electrically isolate the motor windings to prevent short circuiting or burning out thereof. With the windings so isolated from the high current draw, the protector components would cool sufficiently to allow cycling thereof to the on cycle which again permitted high current drawn through the windings. In this manner, the motor was cycled continuously by the protector device under locked rotor or high current draw condition which, of course, is believed to be totally undesirable.

In some instances, attempts were made to utilize a PTCR as a starting resistor in various appliances by, whenever possible, placing the protector device on the motor windings and within the housing of a compressor for driving the appliance. Of course, the increased temperature at the protector device within the compressor increased the off time to an acceptable value which would permit motor restarting. However, at least one of the disadvantageous or undesirable features of this scheme is believed to be that the cost of installing the protector device within the compressor housing more than offset and savings which may have been gleaned by using a PTCR as a starting resistor in the motor circuit rather than a more conventional motor starting relay.

SUMMARY OF THE INVENTION

Among the several objects of the present invention may be noted the provision of a method for assembling a temperature responsive resistance member which overcomes the aforementioned disadvantageous or undesirable features, as well as others, which were discussed hereinbefore with respect to the prior art; the provision of such assembling method in which heat is transferred from the temperature responsive resistance member to another component in the main only by radiation; the provision of such assembling method in which terminals not only mechanically support the temperature responsive resistance member but also effects an electrical connection therewith; the provisions of such assembling method in which the temperature responsive resistance member is electrically isolated from but spaced closely adjacent to a thermal responive switch means wherein heat generated by the temperature responsive resistance member upon its energization is transmitted to the thermally responsive switch means; the provision of such assembling method in which the temperature responsive resistance member is predeterminately spaced from an enclosing housing therefor; and the provision of such assembling method in which the components thereof are simplistic in design and operation, economically manufactured, and easily assembled. Other objects and advantageous features of the invention will be in part apparent and in part pointed out hereinafter.

In general, a method in one form of the invention is provided for assembling a temperature responsive resistance member within a pair of separable housings. This method includes the steps of: mounting the temperature responsive resistance member in both supporting engagement and electrical contacting engagement between a pair of electrical terminals; and joining the separable housing against displacement so that the temperature responsive resistance member in both the supporting engagement and the electrical contacting engagement with the terminals is disposed within the housings in predetermined space relation therewith and with electrical connection portions of the terminals extending exteriorly of the housings.

BRIEF DESCRIPTION OF THE DRAWINGS

FIGS. 1-3 are schemtic diagrams of at least some circuits for a dynamoelectric machine showing a combination starter-protector device and teaching principles of a method for protecting windings of the dynamoelectric machine and for starting it;

FIG. 7 is a plan view of one of the terminals of FIG. 6; and

Corresponding reference characters indicate corresponding parts throughout the several views of the drawings.

The exemplifications set out herein illustrate the preferred embodiments of the invention in one form thereof, and such exemplifications are not to be construed as limiting, in any manner, the disclosure or the scope of the invention.

DETAILED DESCRIPTION OF THE PREFERRED EMBODIMENTS

Figure 8:
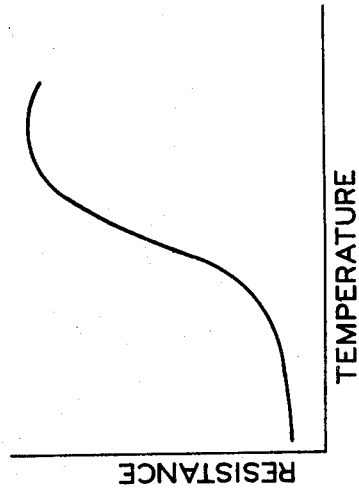
FIG. 8 is a graphical representation illustrating the relationship of temperature and resistance of a thermally responsive resistance member upon passage of current therethrough.

Referring now in general to the drawings, there is illustrated a method for protecting a start or auxiliary winding 1 and a run or main winding 3 in a circuit, as indicated generally at 5, 7, 9 (FIGS. 1-3), of a dynamoelectric machine 11, such as an electric motor of a split phase type, in the event of an overload thereof. In this protecting method, means, such as a thermally responsive switch means or device or bimental disc 13 of a combination starter-protector device indicated generally at 15, is actuated in response to a certain or preselected thermal condition which may accompany a current overload, or other overload condition, for interrupting circuits 5, 7, 9 to both start winding 1 and run winding 3. Heat is transmitted generally from means, such as temperature responsive resistance member, thermistor, or a positive temperature coefficient resistor 17 (referred to hereinafter as a PTCR), for controlling starting of motor 11 to the interrupting means or bimetal switch or disc 13 (FIG. 4) so as to generally maintain circuits 5, 7, 9 effectively interrupted for at least a predetermined period. Starting controlling means or PTCR 17 is operable generally in response to current flow therethrough to increase its resistance generally as a function of its temperature (FIG. 8) for taking start winding 1 out of circuit relation with run winding 3 generally at a certain or preselected speed of dynamoelectric machine 11. It may be noted that for the most part, the heat transferred from PTCR 17 to bimetal disc 13 is transferred generally by radiation, and while the bimental disc may cycle several times between its circuit completing and interruption positions during the motor or circuit overload, the heat transferred from the PTCR to the bimetal disc assists ineffectively preventing the bimetal disc from remaining in the circuit completing position while the overload continues, i.e., the circuit is effectively open or interrupted. In other words, the heat transferred by PTCR 17 to bimetal disc 13 lengthens or increases its "off time", i.e., when the bimetal disc is in its circuit breaking position, even though the bimetal disc may cycle between its circuit making and breaking positions, as discussed in greater detail hereinafter.

More particularly and with specific reference to FIG. 1, connection of motor 11 across a pair of power terminals L1, L2 by suitable means, such as an on-off type switch or the like 19, is effective to energize both start winding 1 and run winding 3 thereby to start or energize the motor by drawing current through its circuit 5. As illustrated generally in the graphical representation of FIG. 8, the resistance of PTCR 17 to current flow therethrough increases as a function of its temperature. Assuming that the temperature of PTCR 17 is rather low at motor start-up, the PTCR will initially pass current at a value sufficiently great enough to permit the energization of start winding 1 thereby to effect a higher starting torque of the motor during the starting or start-up period thereof. Referring again to the graphical representation of FIG. 8, as the temperature of PTCR 17 increases in response to current flow therethrough, the resistance to such current flow also increases to a value which, in general, effects the electrical disassociation or circuit interruption of starting winding 1 from circuit relation with run winding 3. The point in time during motor start-up that start winding 1 may be so electrically disassociated or taken out of circuit relation with run winding 3 by PTCR 17 may be predetermined so as to generally coincide with the running speed of motor 11. That is to say, start winding 1 may be disabled or taken out of circuit 5 generally about the time motor 11 attains its running speed. Of course, PTCR 17 will not act to obviate current flow to start winding 1 during running of motor 11 but it will throttle or restrict such current flow to such a minimal or small value that the start winding is geneally ineffectual in circuit 5, as is well known in the art. It may be noted that heat generated by PTCR 17 during start-up and running of motor 11 may be radiated or directed toward bimetal disc 13 at least through an opening 21, FIG. 4, in one of a pair of terminals or terminal means 23, 25 of combination starter-protector device 15 toward bimental disc 13 which is disposed closely adjacent the PTCR in heat transfer relation therewith, but electrically isolated therefrom, within the combination starter-protector device, as discussed in greater detail hereinafter.

A plurality of terminals 29, 31, 33 may be provided in combination starter-protector device 15 for connection in a three phase system within the scope of the invention; however, for purposes of simplicity, the combination starter-protector device is discussed herein as connected in a single phase system. During the start-up and running stages of motor 11, bimetal disc 13 may be disposed in its circuit making or completing position in circuit 5 in making engagement between terminals 29, 33. In its circuit making position, bimetal disc 13 is heated in response to current flowing therethrough. When motor 11 is running under normal operating conditions, heat generated by current flowing through bimetal disc 13 is predeterminately less than that necessary for effecting movement of the bimetal disc with characteristic snap-action from its circuit completing position to a circuit interrupting position disengaged from terminals 29, 33. Of course, materials for bimetal disc 13 and the size and shape thereof may be chosen or predetermined so that it may be cycled between its circuit making and breaking positions in response to a selected amount of heat supplied thereto, as is well known in the art. Therefor, under normal operating conditions of motor 11, bimetal disc 13 remains in its circuit making position urging its pair of electrical contacts 35, 37 into electrical contacting engagement with terminals 29, 33. While movement of bimetal disc 13 between its circuit making and circuit breaking positions is discussed herein as a snap-action movement, it is contemplated that bimetal disc 13 may be constructed so as to be a slow acting type switch, i.e. movable between its circuit completing and interrupting positions without snap-action within the scope of the invention.

From the foregoing, it is apparent that bimetal disc 13 may be made operable in the combination starter-protector device 15 only in response to its own heat generated by current flowing therethrough which may be supplemented by heat supplied or applied from PTCR 17 to the bimetal, as discussed in greater detail hereinafter. However, in some motor applications, means, such as a resistance heater or heating element or coil 27, for also heating bimetal disc 13 may be connected in circuit 5 in series relation between terminals 29, 31 in combination starter-protector device 15. Heating coil 27 is disposed generally closely adjacent bimental disc 13 in heat transfer relation therewith, and heat generated by the heating coil is, for the most part transferred by radiation to the bimetal disc. When motor 11 is running under normal operating conditions, heat generated by heating coil 27, as well as that generated by bimetal disc 13 in response to current flowing therethrough, is predeterminately less than that amount of heat necessary for effecting actuation of the bimetal disc from its circuit completing position. For purposes of clarity, combination starter-protector device 15 is discussed hereinafter as including heating coil 27, but it will be recalled that the combination starter-protector device may also function without the heating coil in some motor applications, as previously discussed, within the scope of the invention.

As is well known in the art, overload conditions may deleteriously affect components of a motor, such as shorting or burning-out motor windings for instance. These overload conditions may be effected by a plurality of different causes or by combinations of such causes. For instance, some of the well known causes of motor overload conditions are: a running overload; a high temperature overload; an overload occasioned by by a stalled or locked rotor; and a high current overload. Irrespective of the particular cause or combination of causes effecting a motor overload condition, a deleteriously high current is drawn by the motor, and such high current is usually accompanied by or results in a high temperture. Therefore, for the sake of simplifying the discussion of motor overload conditions hereinafter, it is to be understood that any cause for effecting such motor overload will be discussed only within the context of a high current draw or condition accompanied by a high temperature condition with respect to the motor windings.

In the event of the occurrence of an overload or high current condition in motor 11, a relatively large amount of current may be drawn in circuit 5 which could deleteriously affect start winding 1 and run winding 3, as mentioned hereinabove. However, bimetal disc 13 and heating coil 27 are responsive to such high current and temperature increase to correspondingly increase the heat generated thereby, respectively, to effect characteristic snap-action actuation of the bimetal disc breaking its contacts 35, 37 from terminals 29, 33. In this manner, circuit 5 is opened effecting de-energization of motor 11 and isolating or electrically disassociating start winding 1 and run winding 3 from the current overload which may then exist in motor 11 across power terminals L1, L2.

Of course, the opening of circuit 5, as discussed above, also effects de-energization and the resultant cooling of PTCR 17 and heating coil 27. Even with the supplemental heat supplied or radiated from PTCR 17 to bimetal disc 13, the bimetal disc may cool sufficiently in its circuit interrupting position so as to cycle several or a plurality of times between the circuit position and the circuit completing position thereof. Such cycling of bimetal disc 13 may occur throughout or over a predetermined relatively short period of time, and such cycling is only effective to replace motor 11 in circuit relation across power terminals L1, L2 for relatively very short periods of time. When bimetal disc 13 is so cycled to its circuit completing position, PTCR 17 and heating coil 27 are, of course, re-energized to again supply heat to the bimetal disc during the aforementioned relatively short period of time thereby to again effect cyclical movement or actuation of the bimetal disc to its circuit interrupting position. Even though bimetal 13 may cycle, as discussed above, for a brief period of time subsequent to the occurrence of the overload condition in motor 11, it has been found that the supplemental heat transferred for the most part radiation from PTCR 17 to bimetal disc 13 is effective to increase the "off-time" thereof, i.e. when the bimetal disc is in its circuit interrupting position, throughout the aforementioned predetermined relative short period of time. In view of the foregoing, it may also be noted that the predeterminately increased off-time of combination starter-protector device 15, i.e. of bimetal disc 13 therein, occasioned by the supplemental heat supplied or transferred thereto from PTCR 17 allows the PTCR itself to cool. As PTCR 17 cools, the resistance thereof is correspondingly reduced generally as a function of the decreasing temperature. When the resistance and temperature of PTCR 17 are so reduced to a sufficiently low value, the PTCR will again permit the passage therethrough of current at sufficiently high enough values to effect restarting of motor 11. Therefore, when bimetal disc 13 also cools enough to cycle back to its uninterrupted circuit completing position, current is drawn through PTCR 17 at values great enough to again effect re-energization of start winding 1 to aid re-energized run winding 3 in bringing motor 11 up to its predetermined speed. When motor 11 attains its running speed, the self-heating effect of PTCR 17 once again raises its temperature and its resistance value as a function thereof to reduce current flow therethrough to a value which is ineffective with respect to start winding 1; therefore, the start winding may again be taken out of circuit 5 or, in effect, electrically disassociated from energized run winding 3, as previously described, thereby to effect restarting of motor 11. Thus, restarting of motor 11 assumes that the cause of the overload condition has been alleviated or corrected, and if not so alleviated, combination starter-protector device 15 may again operate or function to open circuit 5 taking motor 11 off the line across power terminals L1, L2 as previously described.

Figure 4:
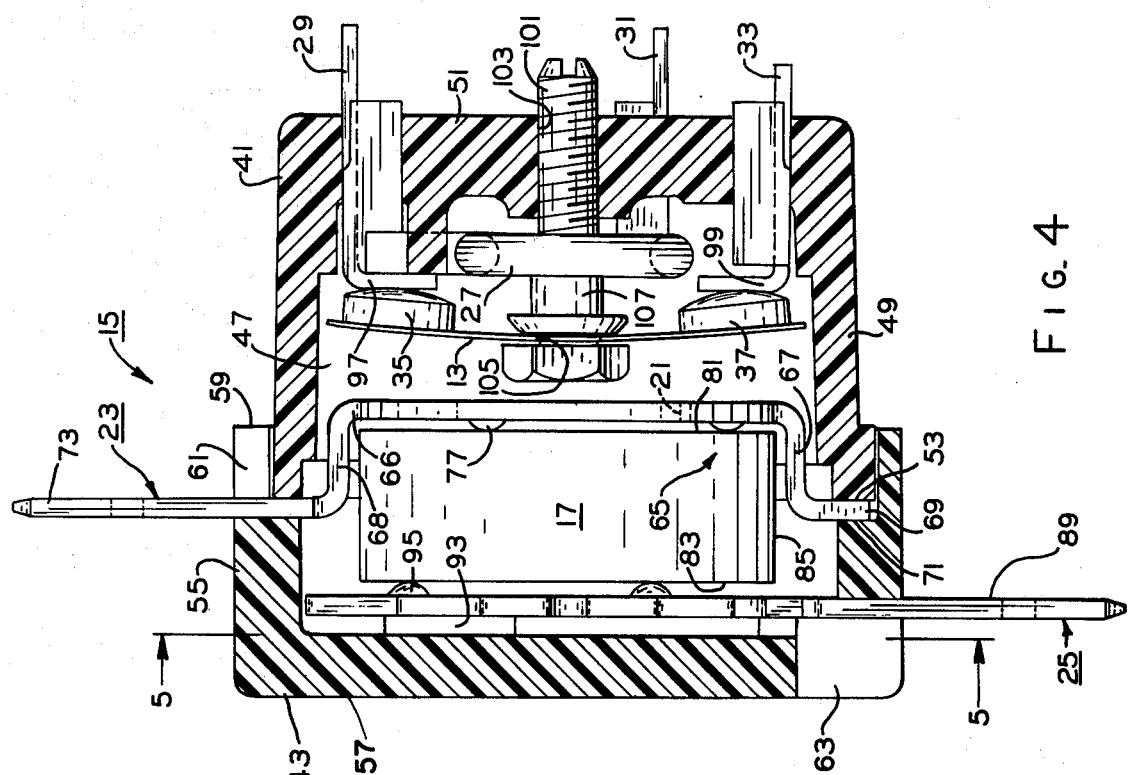
FIG. 4 is a sectional view illustrating the overload protector with starting means of FIGS. 1-3 in cross-section.
Figure 5:
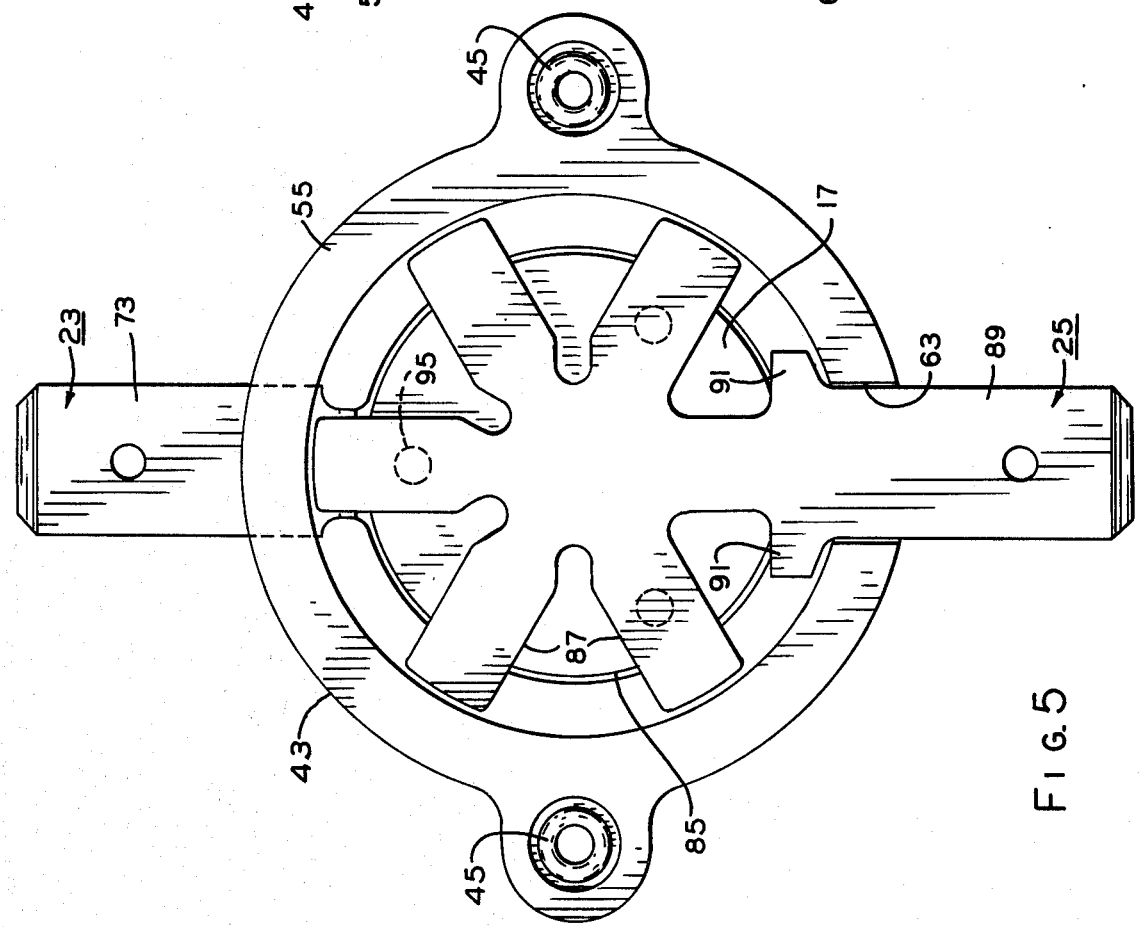
FIG. 5 is a sectional view taken generally along line 5—5 in FIG. 4.

Referring now again to the drawings in general, combination starter-protector device 15 is adapted to be connected in circuit 5, 7, 9 with windings, such as start and run windings 1, 3 of motor 11 (FIGS. 1-3), and the device includes a housing 41 with means, such as bimetal disc 13, movable therein in response to a certain thermal condition for interrupting the circuit in the event, of winding overload (FIGS. 4 and 5). Means, such as PTCR 17, is provided for controlling starting of motor 11, and the PTCR is operable generally to transmit heat to the interrupting means to delay movement thereof to an uninterrupted position effectively completing the circuit. Means, such as terminals 23, 25 is disposed in housing 41 for connecting starting controlling means or PTCR 17 in the circuit and for predeterminately positioning the PTCR generally closely adjacent the interrupting means or bimetal disc 13 in heat transferring relation therewith.

More particularly and with specific reference to FIGS. 4 and 5, housing or casing 41 includes a closure member or end cap 43 interconnected therewith against displacement by any suitable means, such as a pair of rivets 45 for instance, and a housing chamber 47 is formed within the housing and it end cap. Housing 41 is provided with a generally annular sidewall 49, and a base wall 51 is integral with the rightward end of the sidewall while the leftward end 53 thereof is a generally annular free or abutment end. End cap 43 is also provided with a generally annular sidewall 55, and another base wall 57 is integral with the leftward end of the sidewall while the rightward end 59 thereof is a generally annular free end which is disposed in overlapping or generally telescopic sliding engagement with abutment end 53 of housing sidewall 49. Side walls 49, 55 and base walls 51, 57 comprise a plurality of wall means which define housing chamber 47. A pair of generally oppositely spaced, terminal receiving slots or openings 61, 63 are respectively provided through free end 59 of end cap sidewall 55 and also the free end and base wall 57 generally at the juncture thereof.

Terminal 23 is provided with an off-set or recess portion 65 generally comprising wall means, such as a base wall or seating portion 66, through which opening 21 extends, and a pair of integral end walls 67, 68 disposed generally normal to the base wall. One of the end walls 67 is integral with a radially extending lip or abutment 69 which is disposed in abutting or locating engagement between abutment end 53 of housing sidewall 49 and a seat or abutment 71 provided on end cap sidewall 55. An electrical connection or exterior portion 73 of terminal 23 is integral with the other of the end walls 68. Terminal exterior portion 73 is seated on abutment end 53 of housing sidewall 49 and extends through slot 61 in end cap 43 exteriorly of housing 41 for circuit connection purposes. It may be noted that the abutment of terminal connection portion 73 with end cap sidewall 55 about slot 61 therein predeterminately locates terminal 23 with respect to housing 41 and end cap 43 thereof. Further, it may also be noted that end walls 67, 68 and base wall 66 of terminal 23 define off-set or recess means 65 in which PTCR 17 is received in both supporting engagement and electrical contacting engagement with terminal 23, as discussed hereinafter. Base wall 66 is provided with a plurality of seating nodes or dimples 77 for positioning or supporting engagement and electrical contacting engagement with PTCR 17. Although terminal 23 has been described as having a generally off-set portion 65, it is contemplated that other physical shapes, such as an annular recess for instance, may be provided within the scope of the invention. Although PTCR 17 is shown and described in one form of the invention herein, it is contemplated that other thermistors well known to the art having the inherent characteristic of being self-heating wherein its resistance to current flow is generally a function of its temperature may be utilized within the scope of the invention. PTCR 17 is generally cylindric in shape having a pair of opposite ends 81, 83 interconnected by a peripheral portion 85. Although PTCR 17 is shown and described as generally cyclindric in shape, it is contemplated that a PTCR shaped other than generally cylindric may be utilized within the scope of the invention. Rightward end 81 and at least a part of peripheral portion 85 are disposed within off-set of terminal 23 with dimples 77 of terminal base wall 66 and end wall 67, 68 in both supporting engagement and electrical contacting engagement with at least a portion of the rightward end and peripheral portion of PTCR 17, respectively.

Terminal 25 is provided with a plurality of generally flat, radially extending fingers or seating portions 87, and the free ends of at least some of the fingers may be provided for abutting or locating engagement with end cap sidewall 55 interiorly of housing chamber 47. An electrical connection or exterior portion 89 of terminal 25 is integral with one of fingers 87 and extends through slot 63 exteriorly of end cap 43 for circuit connection purposes. It may be noted that the abutment of terminal connection portion 89 with end cap sidewall 55 and base wall 57 about slot 63 therein at least in part predeterminately locates terminal 25 with respect to end cap 43. Other means, such as a pair of oppositely extending fins or locating abutments 91, for locating engagement with end cap sidwall 55 within housing chamber 47 may also be integrally provided on connection portion 89 of terminal 25. A plurality of generally axially extending abutments or hubs 93 are integrally formed on end cap base wall 57 and engaged with the leftward side of terminal 25 for urging a plurality of dimples 95 on some of fingers 87 into both supporting engagement and electrical contacting engagement with leftward end 83 of PTCR 17. In this manner, the urging of terminal 25 into engagement with PTCR leftward end 83 not only supports PTCR 17 within off-set 65 of terminal 23 against displacement therefrom but also ensures good electrical contacting engagement between terminals 23, 25 and PTCR 17.

Terminals 29, 31, 33 are molded or otherwise disposed in base wall 51 of housing 41 extending therethrough, and as previously mentioned, terminals 29, 33 are exteriorly connected in circuits 5, 7, 9 of FIGS. 1–3. The interior ends of terminals 29, 33 define stationary electrical contacts 97, 99 for making and breaking engagement with movable contacts 35, 37 on bimetal disc 13, as further discussed hereinafter. While terminal 29 is shown with an exterior portion for connection in a three phase system, it is contemplated that only the contact 97 may be utilized within the scope of the invention. As previously mentioned, heating coil 27 may be connected in series circuit relation between stationary contact 97 and terminal 31 so that it may be isolated from power terminals L1, L2 along with start winding 1 and run winding 3 upon the interruption of circuit 5, as previously mentioned.

An adjustable screw 101 is threadedly received in a centrally located threaded opening or aperture 103 provided in base wall 51 of housing 41, and the screw extends generally coaxially through heating coil 27. Bimetal disc 13 may be generally frustoconically shaped having a central opening 105 therein which is received on screw 101 adjacent the head thereof, and the bimetal disc is clamped or fixedly positioned between the head of the screw and a retainer 107 fixedly disposed on the screw. Movable contacts 35, 37 are soldered, welded or otherwise connected by suitable means well known in the art to the rightward side of bimetal disc 13 for making and breaking engagement with stationary contacts 97, 99, respectively, of course, the frustoconical shape of bimetal disc 13 is effective to impart snap-action movement to movable contacts 35, 37 between their making and breaking positions with respect to stationary contacts 97, 99, and screw 101 may be manually ajusted to adjustably predetermine the force necessary to effect snap-action of bimetal disc 13 between the making and breaking positions of movable contacts 35, 37. To complete the description of combination starter-protector 15, it may be noted that bimetal 13 is disposed in housing chamber 47 closely adjacent rightward end 81 of PTCR 17 which is communicated through opening 21 in terminal 23 in heat transfer relation with the leftward side of bimetal disc 13.

Figure 6:
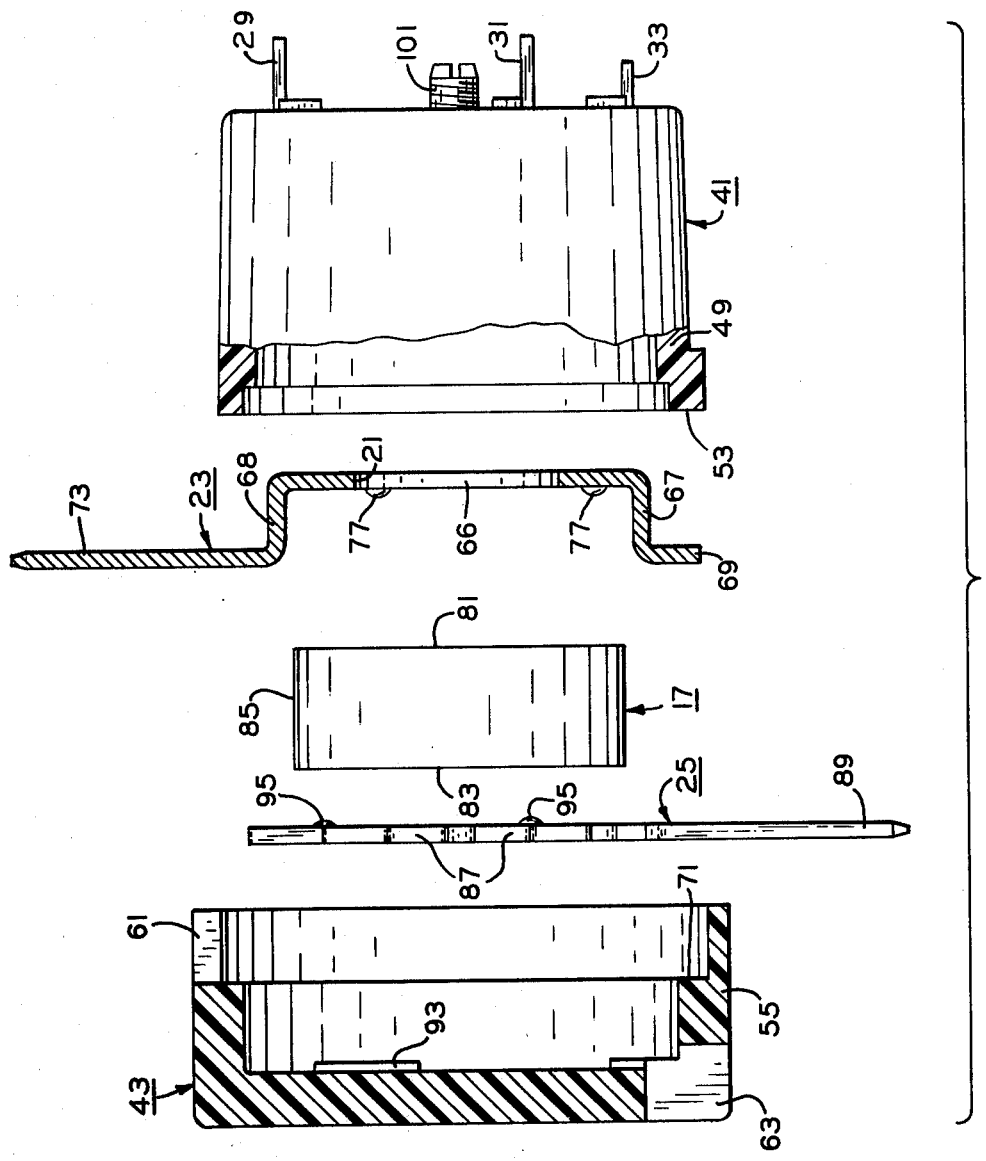
FIG. 6 is an exploded view of at least some of the components of the overload protector of FIG. 4 to illustrate a device including the housing, PTCR and terminals and to teach a method of assembly thereof in one form of the invention.

As may be seen in FIGS. 4–6, there is illustrated in one form of the invention a method of assembling a temperature responsive resistance member, such as PTCR 17, within a pair of separable housings, or housing members such as housing 41 and end cap 43. In this method, PTCR 17 is mounted in both supporting engagement and electrical contacting engagement between terminal pair 23, 25. Housing 41 and end cap 43 then are joined against displacement so as to encase therein PTCR 17 in both the supporting engagement and the electrical contacting engagement with terminals 23, 25 and with portions 73, 89 thereof extending exteriorly of housing 41 and end cap 43.

More particularly, PTCR 17 may be inserted into off-set 65 of terminal 23 so that the rightward end 81 is in supporting engagement and in electrical contacting engagement with dimples 77 of terminal base wall 6, respectively. Terminal 25 may also be assembled to end cap 43 with terminal connection portion 89 extending through slot 63 in locating engagement therewith and with the free ends of fingers 87 in locating engagement with the interior of end cap sidewall 55. Of course, the disposition of PTCR 17 in terminal 23 and the disposition of terminal 25 in end cap 43 may be alternately or simultaneously performed. Terminal 23 with PTCR 17 therein may now be located with respect to housing 41 and end cap 43 by disposing connecting portion 73 of terminal 23 and slot 61 in the end cap in locating engagement with each oher. Of course, with terminal 23 and end cap 43 so located, dimples 95 of terminal 25 are disposed in both supporting engagement and electrical contact engagement with end 83 of PTCR 17. Housing 41 may be disposed with the leftward end 53 of its side wall 49 in supporting or abutting relation with lip 69 of terminal 23 as it is located with respect to end cap 43, as discussed above, or may be subsequently disposed on the lip. At this time, rivets 45 may be disposed in aligned apertures respectively provided therefor in housing 41 and end cap 43 and riveted over so as to join or maintain the housing and the end cap against displacement or separation from each other.

Referring now in general to FIG. 6 and recapitulating, at least in part, with respect to the foregoing, a device, such as combination starter-protector 15 or other electrical component for instance, may be assembled in accordance with the teachings of the assembling method, as discussed hereinabove, for connection in an electrical circuit, such as those indicated at 5, 7, 9 for instance (FIGS. 1–3). Device 15 includes a pair of housings, such as housing 41 and end cap 43 joined together against displacement, such as by rivets 45 of other suitable connecting means, and a temperature responsive resistance member, such as PTCR (FIGS. 4 and 5). A pair of terminals 23, 25 respectively include means, such as terminal off-set 65 and terminal fingers 87, respectively, encased within the housings for mounting PTCR 17 therein so that the terminals are disposed in both supporting engagement and electrical contacting engagement with the PTCR. Means, such as connection portions 73, 89 on terminals 23, 25 extend exteriorly of housing 41 and end cap 43 for connection in the electrical circuit.

Referring now specifically to FIG. 1, circuit 5 for motor 11 is shown having at least one start winding 1 and at least one run winding 3. Means, such as a lead 109, is electrically interconnected with one of the respective opposite end portions of start winding 1 and run winding 3 for placing them in connection with one side, such as power terminal L1, of a source of power. Other means, such as a lead 111, is connected with the other opposite end of run winding 3 for placing it in connection with the other side, such as power terminal L2, of the power source. Means, such as PTCR 17, has a characteristic of increasing its resistance generally as a funtion of its temperature in response to the flow of power therethrough is disposed in a lead 113 in series circuit relation between the other opposite end of start winding 1 and lead 111. PTCR 17 is thereby operable generally for electrically disassociating start winding 1 from run winding 3 at a selected speed of motor 11 when it is energized by closure of on-off switch 19 interposed in lead 109. Means, such as overload protector 15, may be disposed in one of leads 109, 111 for protecting start winding 1 and run winding 3 in the event of a current overload of motor 11 when it is energized. Combination starter-protector device 15 may include means, such as heating coil 27, responsive to current flowing at least through run winding 3 for generating heat at least upon the occurrence of the current overload and also means, such as bimetal disc 13, adapted to be movable in response to heat transferred thereto at least from the heating coil or heat generating means from an uninterrupted closed or on position in the one of leads 109, 111 to effect the flow of current through circuit 5 to an uninterrupted open on off position interrupting the flow of current through the circuit. Movable means or bimetal disc 13, at least in the open position thereof, is electrically isolated from the disassociating means or PTCR 17 and yet spaced closely adjacent to it for receiving heat which is for the most part radiated therefrom so that the bimetal disc may at least in effect be in its open position for at least predetermined period great enough to permit PTCR 17 to cool to a temperature low enough so that it passes current for motoring starting.

In the operation with the component parts of combination motor-protector 15 and circuit 5 in their respective positions as shown in FIGS. 1 and 4, closure of on-off switch 19 places motor 11 across power terminals L1, L2 so as to be energized or started. Current flows through lead 109 from power terminal L1 to start winding 1 and run winding 3. A portion of the current takes a path through start winding 1, PTCR 17 and leads 111, 113 to terminal 31 of overload protector 15, and the other portion of the current takes a path through run winding 3 and lead 111 to overload protector terminal 31. From terminal 31, the current flows through stationary contact 99 and movable contact 37 in their making positions, bimetal disc 13, movable contact 35 and stationary contact 97 in their making positions, heating coil 27 and terminal 33 to power terminal L2.

When switch 19 is closed to energize circuit 5, PTCR 17 at a relatively cool temperature passes enough current therethrough for effectively energizing start winding 1; however, due to self-heating, the PTCR characteristically increases its resistance generally as a function of its temperature rise thereby to generally throttle current flow to start winding 1. In this manner, start winding 1 is taken out of circuit relation with run winding 3 generally as motor 11 attains its running speed thereafter to be energized only by run winding 3.

In the event of a current overload in circuit 5 which may be occasioned by a stalled or locked rotor condition or other conditions, well known to the art, the high current draw in circuit 5 is effective to increase heat generated in bimetal disc 13 and by heating coil 27. This increased quantity of heat causes bimetal disc 13 to move with characteristic snap-action to its circuit opening or breaking position breaking movable contacts 35, 37 thereon from stationary contacts 97, 99. In this manner, circuit 5 is opened, and PTCR 17 and both start winding 1 and run winding 3 are electrically disassociated or isolated from the power source across power terminals L1, L2 to interrupt current flow through the circuit. With the current flow so interrupted, bimetal disc 13 and heating coil 27 cools so that since current flow to PTCR 17 is also obviated, and it also cools surrending or radiating at least part of its heat through opening 21 in terminal 23 to bimetal disc 13. Such cooling of bimetal disc 13 may cause it to revert from its open position to its closed position to temporarily again complete circuit 5. Such temporary completion of circuit 5 again subjects bimetal disc 13 and heating coil 27 to the high current draw which causes reheating the bimetal disc 13 to again effect movement thereof to its open position interrupting circuit 5. This cycling or fluctuation of bimetal disc 13 between its circuit opening and closing position may occur at least several times. However, it has been found that the heat radiated from PTCR 17 to bimetal disc 13 supplements the reduced amount of heat generated therein and/or supplied thereto from heating coil 13 so as to maintain the bimetal disc in an uninterrupted open position to effectively interrupt circuit 5 for a period of time necessary to allow the PTCR to properly cool to a reduced temperature. In other words, the supplemental amount of heat supplied to bimetal disc 13 from PTCR 17, predeterminately delays or restrains return movement of the bimetal disc to its uninterrupted closed position to effectively complete circuit 5 for a period at least great enough to effect reduction of the temperature and resistance of the PTCR to a value so as to pass a sufficient amount of current to again effectively energize start winding 1 for restarting motor 11. When the heat generated by PTCR 17 or by both the PTCR and heating coil 27 is reduced to a value insufficient to maintain bimetal disc 13 in its open position, the bimetal disc then returns with characteristic snap-action to its uninterrupted closed position remaking movable contacts 35, 37 with stationary contacts 97, 99 thereby to again uninterruptedly complete circuit 5 across power terminals L1, L2. Assuming that the condition effecting the current overload of circuit 5 has been corrected or has corrected itself, then the return of bimetal disc 13 to its circuit making position will again effect current flow through circuit 5 in the same manner previously as discussed above. Since the return of bimetal disc 13 to its uninterrupted circuit making position is predeterminately delayed as previously described, the temperature of PTCR 17 is now reduced to a relatively cool range, and the value of its resistance is correspondingly reduced so that the PTCR may pass current for effectively energizing start winding 1 along with energization of run winding 3 to restart motor 11. Of course, if the current overload persists in circuit, then combination starter-protector 15 will re-cycle, as described above.

Referring now to circuit 7 of FIG. 2, it contains generally the same components and functions generally in the same manner as the previously described circuit 5 except that a capacitor 115 is serially connected in lead 113 between terminal 25 of PTCR 17 and start winding 1. With capacitor 115 in motor circuit 7, motor 11 may be operated as a permanent split capacitor type motor. In the operation of circuit 7, PTCR 17 is operable generally to block capacitor 113 when the temperature and resistance of the PTCR rise to values throttling current flow therethrough to take start winding 1 out of circuit 5, as discussed above.

Circuit 9 of FIG. 3 is provided with the same components and functions in the same manner as the previously discussed circuit 7 with the exception that PTCR 17 is connected in a lead 117 connected with lead 113 in shunt circuit relation with capacitor 115. In circuit 9, PTCR 17 effectively shorts out capacitor 115 during the starting state of motor 11 allowing it to start as a resistance split phase motor with a high starting torque. Self-heating of PTCR 17 and the high resistance thereof, as previously discussed, allows motor 11 to run as a highly efficient permanent split phase capacitor motor.

From the foregoing, it is now apparent that there is provided a novel method of assembling a temperature responsive resistance member 17 within a pair of housing 41, 43 which meets the objects and advantages set forth hereinabove, as well as others. Further, it is contemplated that changes as to the precise connections, arrangements, shapes and details of the components, as well as the precise steps of the method illustrated herein in one form of the invention, may be made by those having ordinary skill in the art without departing from the spirit of the invention or scope thereof as set out in the claims which follow.

What I claim as new and desire to secure by Letters Patent of the United States is:

1. A method of assembling a temperature responsive resistance member so as to be enclosed within a chamber of a pair of separable housings with one of the housings having a pair of openings extending from the chamber exteriorly of the one housing generally in different directions, the method comprising the steps of:
   a. mounting the temperature responsive resistance member in both supporting engagement and electrical contacting engagement between a seating portion of a pair of electrical terminals and positioning an electrical connection portion on the terminals within the openings in the one housing so as to extend exteriorly thereof generally in the different directions, respectively; and
   b. joining the separable housings so that the temperature responsive resistance member is enclosed within the chamber and disposing the seating portions arranged in both the supporting engagement and the electrical contacting engagement with the temperature responsive resistance member within the chamber so that the temperature responsive resistance member is predeterminately spaced within the chamber from the housings only by the seating portions of the terminals.

2. The method as set forth in claim 1 comprising the preliminary step of forming in the seating portion of at least one of the terminals an off-set portion into which at least a portion of the temperature responsive resistance member may be received in both the supporting engagement and the electrical contacting engagement with the at least one terminal during the mounting step.

3. The method as set forth in claim 1 comprising the preliminary step of forming means on at least one of the terminals for abutment with at least a portion of one of the separable housings so as to urge the at least one terminal toward both the supporting engagement and the electrical contacting engagement with the temperature responsive resistance member during the joining and disposing step.

4. The method as set forth in claim 1 comprising the preliminary step of forming means on at least one of the terminals for locating engagement with at least one of the housings during the joining and disposing step.

5. The method as set forth in claim 1 wherein the mounting and positioning step comprises placing at least a portion of the temperature responsive resistance member into an off-set portion provided therefore in at least one of the terminals with the other of the terminals preventing displacement of the temperature responsive resistance member from the off-set portion.

6. The method as set forth in claim 2, wherein the off-set portion includes a base wall on the at least one terminal, and wherein the preliminary step further comprises providing means on the base wall and extending therefrom to effect both the supporting engagement and the electrical contacting engagement with confronting portions of the temperature responsive resistance member during the mounting and positioning step.

7. The method as set forth in claim 2 wherein the offset portion includes recess means having a base wall, and wherein the preliminary step further comprises providing an opening through the base wall communicating with the recess means.

8. A method of assembling a temperature responsive resistance member so as to be enclosed in a chamber defined within a pair of housings with a pair of openings extending from the chamber generally in different directions through at least one of the housings toward the exterior thereof, respectively, said method comprising the steps of:
 a. embracing the temperature responsive resistance member between a pair of electrical terminals and disposing an electrical connection portion of the terminals in the openings so as to extend exteriorly of the at least one housing generally in the different direction, respectively; and
 b. fitting the at least one housing and the other of the housings together in assembled relation so as to enclose the temperature responsive resistance member within the chamber with the electrical connection portions of the terminals respectively protruding through the openings and positioning another portion of each of the terminals with respect to the at least one housing and the other housing within the chamber so as to predeterminately space the temperature responsive resistance member within the chamber from the at least one housing and the other housing.

9. The method as set forth in claim 8 comprising the additional step of connecting the at least one housing and the other housing together in their assembled relation.

10. The method as set forth in claim 8 wherein the at least one housing and the other housing comprise a pair of sidewalls, the openings extending through at least one of the sidewalls, and wherein the fitting and positioning step comprises abutting at least one of the electrical connection portions between the at least one sidewall and the other of the sidewalls.

11. The method as set forth in claim 8 wherein the at least one housing and the other housing comprise a pair of sidewalls, a free end portion on each of the sidewalls extending at least in part in overlaying relation with each other in the assembled relation of the at least one housing and the other housing, the openings extending through the sidewall of the at least one housing, and wherein the fitting and positioning step comprises disposing the electrical connection portions of the terminals within the openings and abutting the electrical connection portion of at least one of the terminals between the sidewalls.

12. The method as set forth in claim 8 wherein one of the at least one housing and the other housings includes a thermally responsive electrical switching device mounted therein, and wherein the fitting and positioning step comprises disposing the temperature responsive resistance member at least closely adjacent the switching device for heat transfer relation therewith.

13. A method of assembling a PTCR having a pair of generally opposite sides within a pair of housings respectively having a sidewall intersecting with a base wall, a pair of openings extending through at least one of the sidewalls, a free end on the other of the sidewalls, and one of the base walls including abutment means; said method comprising the steps of:
 a. seating one of the opposite sides of the PTCR in an off-set provided in a first portion of one of a pair of terminals and the other of the opposite sides of the PTCR against a first portion of the other of the terminals;
 b. disposing the sidewalls in assembled relation with respect to each other with the abutment means urged toward engagement with the first portion of the other terminals generally opposite its seating with the other opposite side of the PTCR and positioning the first and second portions of the terminals with respect to the sidewalls interiorly of the housings so as to predeterminately space the PTCR therefrom with a first and second electrical connection of the one and other terminals extending through the openings and exteriorly of the housings, respectively, the engagement between abutment means and the first portion of the other terminal acting through the PTCR to urge the first electrical connection and at least one lip on the first terminal into engagement with the free end of the other sidewall; and
 c. connecting the housings together with the sidewalls thereof in their assembled relation.

14. A method of assembling a temperature responsive resistance member within a pair of housings of a combination starter-protector device for a dynamoelectric machine with the housings including a plurality of wall means, a pair of openings in one of the wall means of the wall means plurality and extending through at least one of the housings, and a thermally responsive current overload switch device disposed in another of the wall means of the wall means plurality and having a plurality of terminals extending through the other of the housings, said method comprising the steps of:
  a. disposing the temperature responsive resistance member in both supporting engagement and electrical contacting engagement with a pair of terminal means; and
  b. fitting the housings together with electrical connection portions of the terminal means respectively extending at least into the openings and positioning other portions of the terminal means within the housings so as to predeterminately space the temperature responsive resistance member in generally close spaced heat transfer relation with the switch device.

15. A method of assembling a temperature responsive resistance member adapted to generate heat upon its energization within a housing of a combination starter-protector device adapted for operation with a dynamoelectric machine, the housing including a plurality of wall means defining a chamber within the housing, a pair of openings connecting with the chamber and extending through one of the wall means of the wall means plurality, and a thermally responsive current overload switch means mounted within the chamber to another of the wall means of the wall means plurality and having at least a pair of terminals extending therethrough exteriorly of the housing, said method comprising disposing an electrical connection portion of a pair of terminal means at least within the openings, respectively, and positioning the terminal means with the temperature responsive resistance member embraced in both supporting engagement and electrical contacting engagement between the terminal means within the chamber so that the temperature responsive resistance member is spaced from the housing and disposed generally closely adjacent the switch means in heat transfer relation therewith.

16. A method of assembling a temperature responsive resistance member adapted to generate heat upon its electrical energization so as to be spaced generally closely adjacent thermally responsive switch means in heat transfer relation therewith within a pair of housings of a starter-protector device for a dynamoelectric machine, the housings including a pair of sidewalls interconnecting with a pair of base walls, and a pair of opposed seating abutments on the sidewalls, respectively, a pair of openings extending through one of the sidewalls of one of the housings with one of the openings intersecting a free end of the one sidewall, and the thermally responsive switch means being mounted to one of the base walls within the other of the housings, said method comprising the steps of:
  a. positioning one of a pair of terminals within the one housing with a electrical connection portion of the one terminal extending through the other of the openings beyond the one sidewall exteriorly of the one housing and seating a part of another electrical connection portion of the other of the terminals and at least another part of the other terminal on one of the opposed seating abutments on the other of the sidewalls with the another electrical connection portion extending beyond the other sidewall exteriorly of the other housing, the other terminal including an off-set portion extending into the other housing toward the thermally responsive switch means mounted within the other housing to the one base wall thereof, and means for spacing relation with respect to the other sidewall interiorly of the other housing;
  b. embracing the temperature responsive resistance member in both supporting and electrical contacting engagement between the terminals with at least a pair of the temperature responsive resistance member disposed within the off-set portion of the other terminal and at least generally adjacent the spacing means and fitting the one sidewall at least in part generally about the other sidewall so that the another electrical connection portion of the other terminal extends through the one opening with at least the part of the another connection portion of the other terminal and the at least another part thereof seated in abutment between the opposed seating abutments on the sidewalls; and
  c. connecting the housings together in assembled relation.

17. A method of assembling a temperature responsive resistance member in both supporting engagement and electrical contacting engagement with a pair of terminals therefor within a pair of separable housings with at least one of the housings having a pair of openings therein, the method comprising the steps of:
  a. forming in at least one of the terminals an off-set portion including wall means having a plurality of means extending therefrom for effecting both the supporting engagement and the electrical contacting engagement with confronting portions of the temperature responsive resistance member and providing an opening through said wall means generally adjacent the engagement effecting means;
  b. mounting the temperature responsive resistance member in both the supporting engagement and the electrical contacting engagement between the terminals; and
  c. joining the separable housings against displacement so that the temperature responsive resistance member in both the supporting engagement and the electrical contacting engagement with the terminals is disposed within the housings in predetermined space relation therewith and with electrical contacting portions of the terminals extending therefrom at least into the openings so as to be accessible from exteriorly of the housings, respectively.

18. A method of assembling a temperature responsive resistance member adapted to generate heat upon its energization so as to be spaced closely adjacent thermally responsive switch means in heat transfer therewith within a pair of housing members of a starter-protector device for a dynamoelectric machine, the housing members including a plurality of wall means defining a chamber therein, and a pair of openings extending through one of the wall means of the plurality thereof and communicating with the chamber, the method comprising the steps of:
  a. mounting the switch device within the chamber to one of the housing members and disposing at least two terminals of the switch device so as to extend through another of the wall means of the wall means plurality exteriorly of the one housing member; and
  b. joining the one housing member and the other of the housing members so as to respectively engage a pair of terminal means respectively having parts thereof arranged so as to electrically contact and support the temperature responsive resistance member within the chamber and electrical connection portions extending at least into the openings and disposing the temperature responsive resistance member within the chamber in predetermined spaced relation with the wall means of the wall means plurality and with the switch means closely adjacent thereto so that the generated heat may be transferred to the switch means from the temperature responsive resistance member upon its energization.

19. The method as set forth in claim 18 wheren the temperature responsive resistance member is a PTCR.

20. The method as set forth in claim 18 wherein the mounting and disposing step includes providing a third terminal for the switch device through the another wall means of the wall means plurality so as to extend exteriorly of the one housing member and connecting a heater element in circuit relation between the third terminal and one of the two terminals.

21. The method as set forth in claim 18 comprising the preliminary step of providing recess means in the part of at least one of the terminal means in which at least a portion of the temperature responsive resistance member may be arranged in electrical contacting and supporting engagement during the joining and disposing step.

22. The method as set forth in claim 18 comprising the preliminary step of providing passage means through the part of one of the terminal means spaced closest to the switch device so as to pass the generated heat to the switch device from the temperature responsive resistance member upon the energization thereof.

23. The method as set forth in claim 18 comprising the additional step of connecting the one housing member and the other housing member together against displacement from each other.

* * * * *

UNITED STATES PATENT AND TRADEMARK OFFICE
CERTIFICATE OF CORRECTION

PATENT NO. : 4,037,316
DATED : July 26, 1977
INVENTOR(S) : Donald H. Stoll

It is certified that error appears in the above-identified patent and that said Letters Patent are hereby corrected as shown below:

Col. 1, line 60, delete "off" (first occurrence) and insert --"off"--; same line, delete "off" (second occurrence) and insert --"off"--;
       line 65, delete "on" and insert --"on"--.
Col. 2, line 9, delete "off" and insert --"off"--.
Col. 3, line 61, delete "ineffectively" and insert --in effectively--.
Col. 6, line 10, after "circuit" insert --interrupting--;
       line 26, after "part" insert --by--;
       line 32, delete "off-time" and insert --"off-time"--.
Col. 7, line 2, delete "," (comma) (first occurrence);
       line 18, delete "it" and insert --its--.
Col. 8, line 11, delete "wall" (second occurrence) and insert --walls--.
Col. 9, line 22, delete "," (comma) (second occurrence);
       line 23, after "members" insert --,-- (comma);
       line 35, delete "6" and insert --66--.
Col. 10, line 43, delete "on" and insert --"on"--;
       line 45, delete "on off" and insert --or "off"--;
       line 55, delete "motoring" and insert --motor--.
Col. 13, line 27, delete "therefore" and insert --therefor--.

UNITED STATES PATENT AND TRADEMARK OFFICE
CERTIFICATE OF CORRECTION

PATENT NO. : 4,037,316
DATED : July 26, 1977
INVENTOR(S) : Donald H. Stoll

It is certified that error appears in the above-identified patent and that said Letters Patent are hereby corrected as shown below:

Col. 14, line 25, delete "housings" and insert --housing--;
line 46, delete "terminals" and insert --terminal--.

Signed and Sealed this

Fourth Day of April 1978

[SEAL]

Attest:

RUTH C. MASON
Attesting Officer

LUTRELLE F. PARKER
Acting Commissioner of Patents and Trademarks